US 6,714,442 B1

(12) United States Patent
Nahas

(10) Patent No.: US 6,714,442 B1
(45) Date of Patent: Mar. 30, 2004

(54) MRAM ARCHITECTURE WITH A GROUNDED WRITE BIT LINE AND ELECTRICALLY ISOLATED READ BIT LINE

(75) Inventor: Joseph J. Nahas, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/346,256

(22) Filed: Jan. 17, 2003

(51) Int. Cl.[7] .............................. G11C 11/00
(52) U.S. Cl. .................. 365/158; 365/171; 365/173; 365/189.01
(58) Field of Search ................. 365/158, 171, 365/173, 189.01

(56) References Cited

U.S. PATENT DOCUMENTS

| 5,946,227 | A | | 8/1999 | Naji | |
|---|---|---|---|---|---|
| 6,272,041 | B1 | | 8/2001 | Naji | |
| 6,545,906 | B1 | * | 4/2003 | Savtchenko et al. | ........ 365/158 |
| 6,618,295 | B2 | * | 9/2003 | Scheuerlein | ........... 365/189.09 |
| 6,625,057 | B2 | * | 9/2003 | Iwata | ........................ 365/158 |
| 6,657,889 | B1 | * | 12/2003 | Subramanian et al. | ...... 365/158 |

* cited by examiner

*Primary Examiner*—Richard Elms
*Assistant Examiner*—Tuan T. Nguyen
(74) *Attorney, Agent, or Firm*—Robert L. King; James L. Clingan, Jr.

(57) ABSTRACT

Each memory cell of a magnetoresistive random access memory (MRAM) array has a magnetoresistive tunnel junction (MTJ) and a transistor coupled to the MTJ. Writing, occurs by write lines along rows and columns of the array. One set of the write lines is connected to the end of the MTJs that is not connected to the transistors. These write lines are thereby close to the MTJs and thus have good magnetic coupling to the MTJs, which is important in keeping write current low. These write lines are driven on one end by drivers. Sensing on the other hand occurs on a read bit line that is coupled to the end of the transistor of the memory cell that is not coupled to the MTJ. By having the sense amplifier(s) on a different line from the write drivers, sensing is not slowed by the capacitance of the write drivers.

20 Claims, 9 Drawing Sheets

MRAM ARCHITECTURE WITH A GROUNDED WRITE BIT LINE AND ELECTRICALLY ISOLATED READ BIT LINE

CROSS REFERENCE TO RELATED APPLICATIONS

This application is related to the following copending patent applications:

U.S. patent application Ser. No. 10/185,868 entitled "MRAM Architecture with Electrically Isolated Read and Write Circuitry" filed Jun. 28, 2002, and assigned to the assignee hereof; and U.S. patent application Ser. No. 09/978859, entitled "A Method of Writing to a Scalable Magnetoresistance Random Access Memory Element," filed Oct. 16, 2001, now U.S. Pat. No. 6,546,906 issued Apr. 8, 2003 and assigned to the assignee hereof.

FIELD OF THE INVENTION

This invention relates to Magnetoresistive Random Access Memories (MRAMs), and more particularly to architectures for MRAMs.

BACKGROUND OF THE INVENTION

In any memory type, including MRAMs, there is a continuing desire to reduce the memory size and increase performance. One important aspect of performance is the speed with which the memory is read and programmed (written). Speed limitations include such things as the performance of the bit cell and the capacitance of the lines running through the array. A variety of techniques have been developed to improve these characteristics. For example, memory arrays have commonly been divided into subarrays so that no single line is excessively capacitive. This can also reduce power consumption. Such techniques in MRAMs have been developed to reduce the capacitance of bit lines by collecting cells into a group of cells. A global bit line is selectively coupled to only the group that is selected. This coupling has the beneficial effect of reducing the number of memory cells that were coupled to the global bit line.

MRAM memories require currents in metal lines above and below the magnetic tunnel junction to generate magnetic fields that write data to the bit cell. The magnetic fields change the polarization of the magnetic materials in the magnetic tunnel junction changing the state of the bit cell and thus the resistance of the tunnel junction. Placement of the metal lines conducting currents that are used to generate magnetic fields for an MRAM cell relative to the magnetic tunnel junction affects the characteristics of the desired magnetic field. However, a technique for grouping cells to improve the read efficiency involves the addition of a metal line between the tunnel junction and another metal line used for writing the cell. The additional metal line moves the metal line used for writing the cell away from the tunnel junction, thereby reducing the efficiency of the writing. Thus, with this technique, an improvement in read speed is offset by a decrease in write efficiency. The promise of MRAMs is, however, that of a universal memory that can be both high speed and non-volatile.

BRIEF DESCRIPTION OF THE DRAWINGS

The foregoing and further and more specific objects and advantages of the instant invention will become readily apparent to those skilled in the art from the following detailed description of the invention taken in conjunction with the following drawings:

FIG. 4 is a graph illustrating the timing diagram of the word current and the bit current when both are turned on;

FIG. 9 is a graph illustrating the timing diagram of the word current and the bit current when only the bit current is turned on;

FIG. 10 is a graph illustrating the rotation of the magnetic moment vectors for a magnetoresistive random access memory device when only the bit current is turned on;

DETAILED DESCRIPTION OF THE INVENTION

A memory architecture uses separate word lines for the read and write operations as well as separate bit lines for the read and write operations. These characteristics provide the benefits of smaller write driver area and thus smaller average bit size for the memory core.

Figure 1:
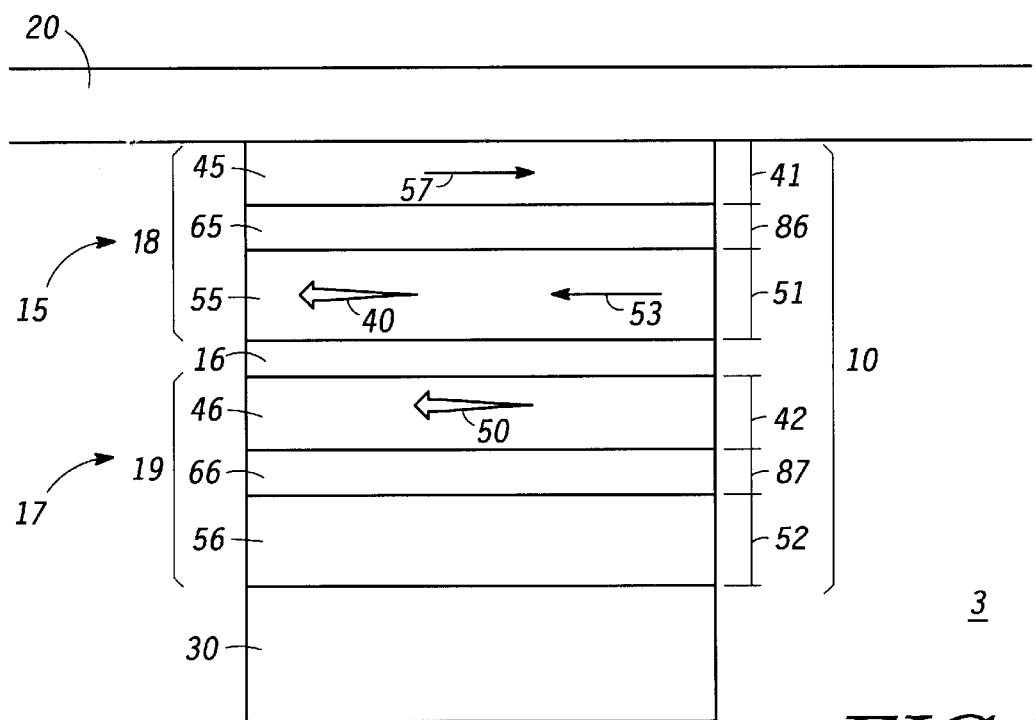
FIG. 1 is a simplified sectional view of a magnetoresistive random access memory device.

Turn now to FIG. 1, which illustrates a simplified sectional view of an MRAM array 3 in accordance with the preferred embodiment of the present invention. In this illustration, only a single magnetoresistive memory device 10 is shown, but it will be understood that MRAM array 3 consists of a number of MRAM devices 10 and we are showing only one such device for simplicity in describing the writing method.

MRAM device 10 includes a write word line 20 and a write bit line 30. Write word line 20 and write bit line 30 include conductive material such that a current can be conducted. In this illustration, write word line 20 is positioned on top of MRAM device 10 and write bit line 30 is positioned on the bottom of MRAM device 10 and is directed at a 90° angle to word line 20 (See FIG. 2). As an alternative, write word line 20 may be positioned on the bottom of MRAM device 10 and write bit line 30 may be positioned on top of MRAM device 10

MRAM device 10 includes tunnel junction comprising a first magnetic region 15, a tunneling barrier 16, and a second magnetic region 17, wherein tunneling barrier 16 is sandwiched between first magnetic region 15 and second magnetic region 17. In the preferred embodiment, magnetic region 15 includes a tri-layer structure 18, which has an anti-ferromagnetic coupling spacer layer 65 between two ferromagnetic layers 45 and 55. Anti-ferromagnetic coupling spacer layer 65 has a thickness 86 and ferromagnetic layers 45 and 55 have thicknesses 41 and 51, respectively. Further, magnetic region 17 has a tri-layer structure 19, which has an anti-ferromagnetic coupling spacer layer 66 between two ferromagnetic layers 46 and 56. Anti-ferromagnetic coupling spacer layer 66 has a thickness 87 and ferromagnetic layers 46 and 56 have thicknesses 42 and 52, respectively.

Generally, anti-ferromagnetic coupling spacer layers 65 and 66 include at least one of the elements Ru, Os, Re, Cr, Rh, Cu, or combinations thereof. Further, ferromagnetic layers 45, 55, 46, and 56 include at least one of elements Ni, Fe, Mn, Co, or combinations thereof. Also, it will be understood that magnetic regions 15 and 17 can include synthetic anti-ferromagnetic (SAF) layer material structures other than tri-layer structures and the use of tri-layer structures in this embodiment is for illustrative purposes only. For example, one such synthetic anti-ferromagnetic layer material structure could include a five-layer stack of a ferromagnetic layer/anti-ferromagnetic coupling spacer layer/ferromagnetic layer/anti-ferromagnetic coupling spacer layer/ferromagnetic layer structure.

Ferromagnetic layers 45 and 55 each have a magnetic moment vector 57 and 53, respectively, that are usually held anti-parallel by coupling of the anti-ferromagnetic coupling spacer layer 65. Also, magnetic region 15 has a resultant magnetic moment vector 40 and magnetic region 17 has a resultant magnetic moment vector 50. Resultant magnetic moment vectors 40 and 50 are oriented along an anisotropy easy-axis in a direction that is at an angle, preferably 45°, from write word line 20 and write bit line 30 (See FIG. 2). Further, magnetic region 15 is a free ferromagnetic region, meaning that resultant magnetic moment vector 40 is free to rotate in the presence of an applied magnetic field. Magnetic region 17 is a pinned ferromagnetic region, meaning that resultant magnetic moment vector 50 is not free to rotate in the presence of a moderate applied magnetic field and is used as the reference layer.

While anti-ferromagnetic coupling layers are illustrated between the two ferromagnetic layers in each tri-layer structure 18, it will be understood that the ferromagnetic layers could be anti-ferromagnetically coupled through other means, such as magnetostatic fields or other features. For example, when the aspect ratio of a cell is reduced to five or less, the ferromagnetic layers are anti-parallel coupled from magnetostatic flux closure.

In the preferred embodiment, MRAM device 10 has tri-layer structures 18 that have a length/width ratio in a range of 1 to 5 for a non-circular plan. However, we illustrate a plan that is circular (See FIG. 2). MRAM device 10 is circular in shape in the preferred embodiment to minimize the contribution to the switching field from shape anisotropy and also because it is easier to use photolithographic processing to scale the device to smaller dimensions laterally. However, it will be understood that MRAM device 10 can have other shapes, such as square, elliptical, rectangular, or diamond, but is illustrated as being circular for simplicity.

Further, during fabrication of MRAM array 3, each succeeding layer (i.e. 30, 55, 65, etc.) is deposited or otherwise formed in sequence and each MRAM device 10 may be defined by selective deposition, photolithography processing, etching, etc. in any of the techniques known in the semiconductor industry. During deposition of at least the ferromagnetic layers 45 and 55, a magnetic field is provided to set a preferred easy magnetic axis for this pair (induced anisotropy). The provided magnetic field creates a preferred anisotropy axis for magnetic moment vectors 53 and 57. The preferred axis is chosen to be at a 45° angle between write word line 20 and write bit line 30, as will be discussed presently.

Figure 2:
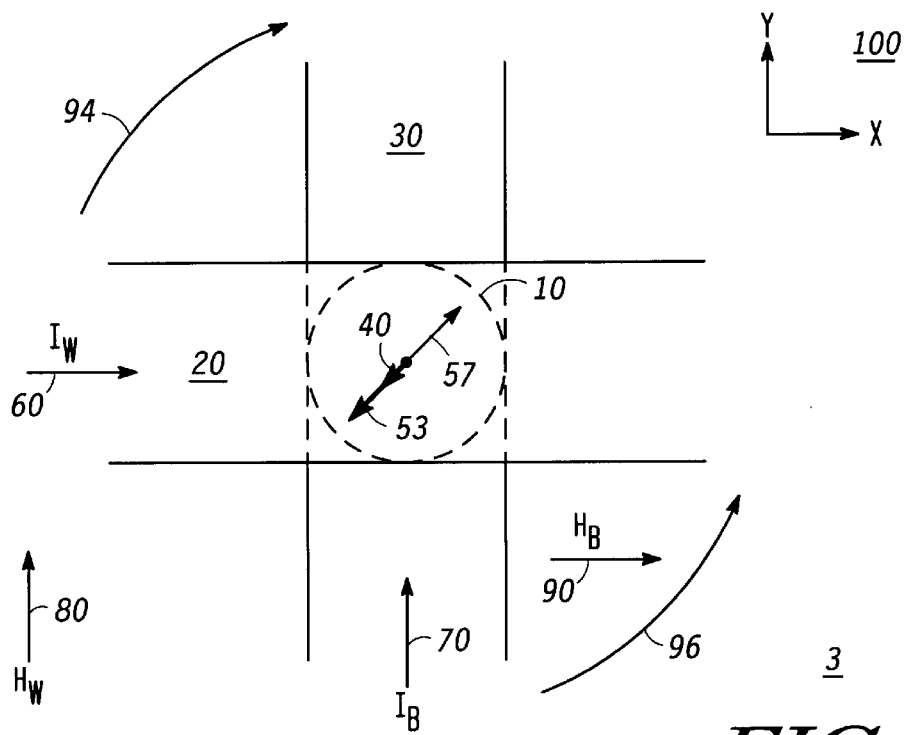
FIG. 2 is a simplified plan view of a magnetoresistive random access memory device with word and bit lines.

Turn now to FIG. 2, which illustrates a simplified plan view of a, MRAM array 3 in accordance with the present invention. To simplify the description of MRAM device 10, all directions will be referenced to an x- and y-coordinate system 100 as shown and to a clockwise rotation direction 94 and a counter-clockwise rotation direction 96. To further simplify the description, it is again assumed that N is equal to two so that MRAM device 10 includes one tri-layer structure in region 15 with magnetic moment vectors 53 and 57, as well as resultant magnetic moment vector 40. Also, only the magnetic moment vectors of region 15 are illustrated since they will be switched.

To illustrate how the writing methods work, it is assumed that a preferred anisotropy axis for magnetic moment vectors 53 and 57 is directed at a 45° angle relative to the negative x- and negative y-directions and at a 45° angle relative to the positive x- and positive y-directions. As an example, FIG. 2 shows that magnetic moment vector 53 is directed at a 45° angle relative to the negative x- and negative y-directions. Since magnetic moment vector 57 is generally oriented anti-parallel to magnetic moment vector 53, it is directed at a 45° angle relative to the positive x- and positive y-directions. This initial orientation will be used to show examples of the writing methods, as will be discussed presently.

In the preferred embodiment, a write word current 60 is defined as being positive if flowing in a positive x-direction and a write bit current 70 is defined as being positive if flowing in a positive y-direction. The purpose of write word line 20 and write bit line 30 is to create a magnetic field within MRAM device 10. A positive write word current 60 will induce a circumferential write word magnetic field, $H_w$ 80, and a positive write bit current 70 will induce a circumferential write bit magnetic field, $H_B$ 90. Since, in this example, write word line 20 is above MRAM device 10, in the plane of the element, $H_w$ 80 will be applied to MRAM device 10 in the positive y-direction for a positive write word current 60. Similarly, since write bit line 30 is below MRAM device 10, in the plane of the element, $H_B$ 90 will be applied to MRAM device 10 in the positive x-direction for a positive write bit current 70. It will be understood that the definitions for positive and negative current flow are arbitrary and are defined here for illustrative purposes. The effect of reversing the current flow is to change the direction of the magnetic field induced within MRAM device 10. The behavior of a current induced magnetic field is well known to those skilled in the art and will not be elaborated upon further here.

Figure 3:
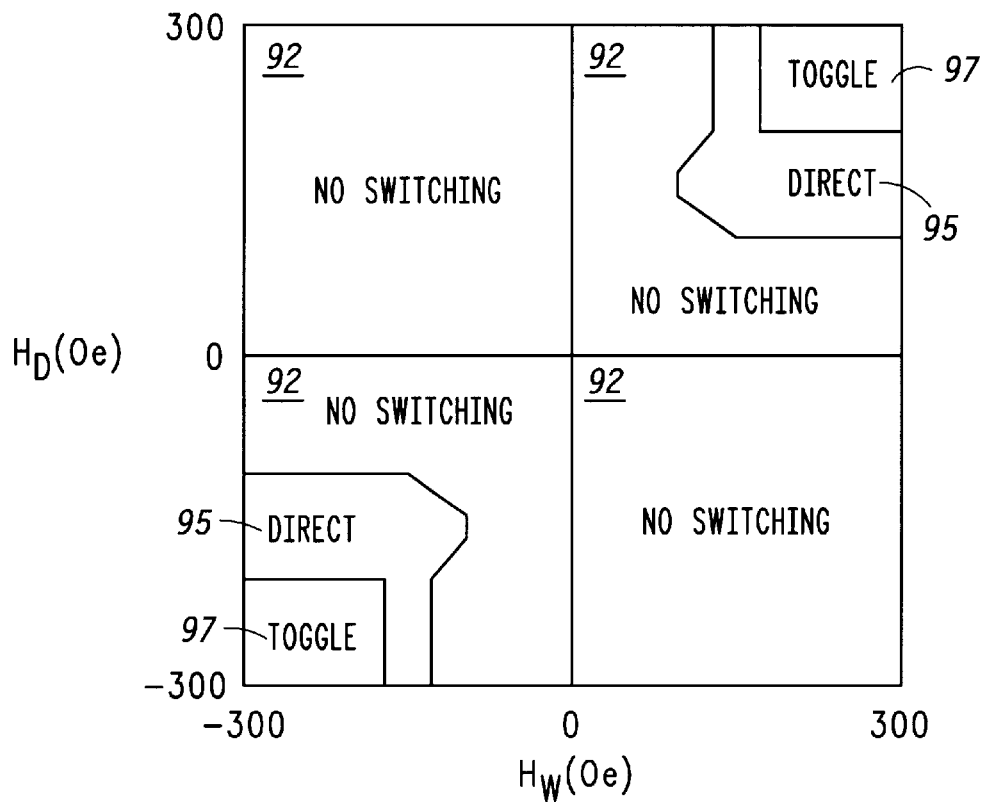
FIG. 3 is a graph illustrating a simulation of the magnetic field amplitude combinations that produce the direct or toggle write mode in the magnetoresistive random access memory device.
Figure 4:
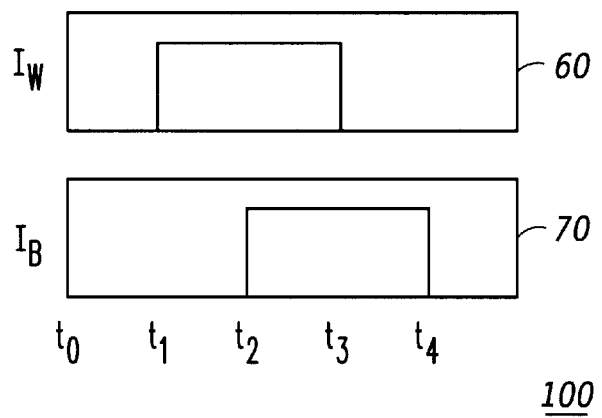

Turn now to FIG. 3, which illustrates the simulated switching behavior of a SAF tri-layer structure. The simulation consists of two single domain magnetic layers that have close to the same moment (a nearly balanced SAF) with an intrinsic anisotropy, are coupled anti-ferromagnetically, and whose magnetization dynamics are described by the Landau-Lifshitz equation. The x-axis is the write word line magnetic field amplitude in Oersteds, and the y-axis is the write bit line magnetic field amplitude in Oersteds. The magnetic fields are applied in a pulse sequence 100 as shown in FIG. 4 wherein pulse sequence 100 includes write word current 60 and write bit current 70 as functions of time.

There are three regions of operation illustrated in FIG. 3. In a region 92 there is no switching. For MRAM operation in a region 95, the direct writing method is in effect. When using the direct writing method, there is no need to determine the initial state of the MRAM device because the state is only switched if the state being written is different from the state that is stored. The selection of the written state is determined by the direction of current in both write word line 20 and write bit line 30. For example, if a '1' is desired to be written, then the direction of current in both lines will be positive. If a '1' is already stored in the element and a '1' is being written, then the final state of the MRAM device will continue to be a '1'. Further, if a '0' is stored and a '1' is being written with positive currents, then the final state of the MRAM device will be a '1'. Similar results are obtained when writing a '0' by using negative currents in both the write word and write bit lines. Hence, either state can be programmed to the desired '1' or '0' with the appropriate polarity of current pulses, regardless of its initial state. Throughout this disclosure, operation in region 95 will be defined as "direct write mode".

For MRAM operation in a region 97, the toggle writing method is in effect. When using the toggle writing method, there is a need to determine the initial state of the MRAM device before writing because the state is switched every time the MRAM device is written to, regardless of the direction of the currents as long as the same polarity current pulses are chosen for both write word line 20 and write bit line 30. For example, if a '1' is initially stored then the state of the device will be switched to a '0' after one positive current pulse sequence is flowed through the write word and write bit lines. Repeating the positive current pulse sequence on the stored '0' state returns it to a '1'. Thus, to be able to write the memory element into the desired state, the initial state of MRAM device 10 must first be read and compared to the state to be written. The reading and comparing may require additional logic circuitry, including a buffer for storing information and a comparator for comparing memory states. MRAM device 10 is then written to only if the stored state and the state to be written are different. One of the advantages of this method is that the power consumed is lowered because only the differing bits are switched. An additional advantage of using the toggle writing method is that only uni-polar voltages are required and, consequently, smaller N-channel transistors can be used to drive the MRAM device. Throughout this disclosure, operation in region 97 will be defined as "toggle write mode".

Both writing methods involve supplying currents in write word line 20 and write bit line 30 such that magnetic moment vectors 53 and 57 can be oriented in one of two preferred directions as discussed previously. To fully elucidate the two switching modes, specific examples describing the time evolution of magnetic moment vectors 53, 57, and 40 are now given.

Figure 5:
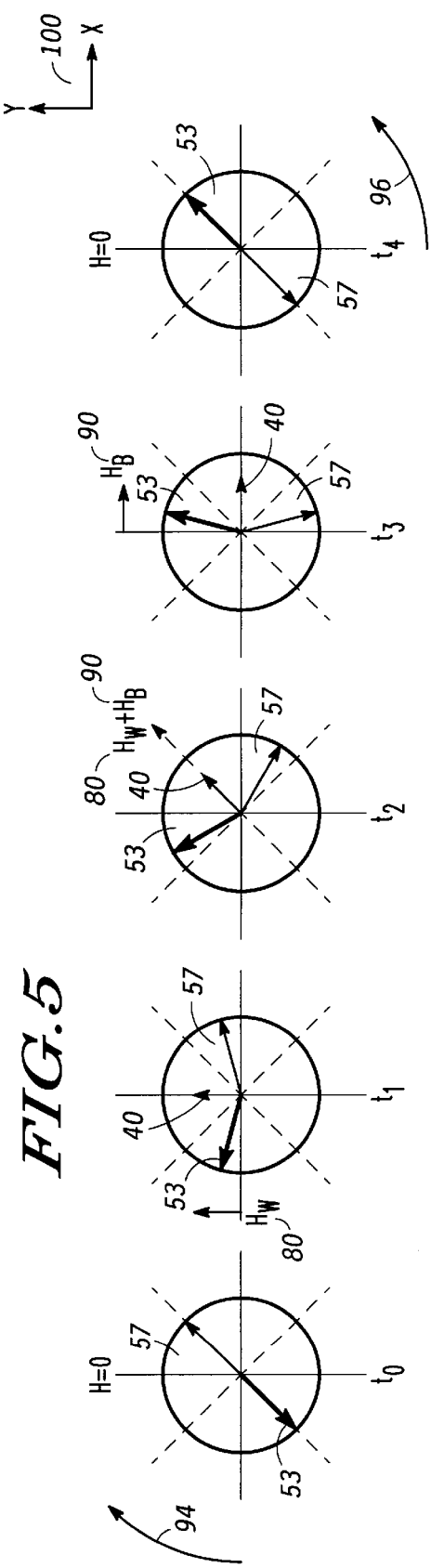
FIG. 5 is a diagram illustrating the rotation of the magnetic moment vectors for a magnetoresistive random access memory device for the toggle write mode when writing a '1' to a '0'.

Turn now to FIG. 5 which illustrates the toggle write mode for writing a '1' to a '0' using pulse sequence 100. In this illustration at time $t_0$, magnetic moment vectors 53 and 57 are oriented in the preferred directions as shown in FIG. 2. This orientation will be defined as a '1'.

At a time $t_1$, a positive write word current 60 is turned on, which induces $H_w$ 80 to be directed in the positive y-direction. The effect of positive $H_w$ 80 is to cause the nearly balanced anti-aligned MRAM tri-layer to "FLOP" and become oriented approximately 90° to the applied field direction. The finite anti-ferromagnetic exchange interaction between ferromagnetic layers 45 and 55 will allow magnetic moment vectors 53 and 57 to now deflect at a small angle toward the magnetic field direction and resultant magnetic moment vector 40 will subtend the angle between magnetic moment vectors 53 and 57 and will align with $H_w$ 80. Hence, magnetic moment vector 53 is rotated in clockwise direction 94. Since resultant magnetic moment vector 40 is the vector addition of magnetic moment vectors 53 and 57, magnetic moment vector 57 is also rotated in clockwise direction 94.

At a time $t_2$, positive write bit current 70 is turned on, which induces positive $H_B$ 90. Consequently, resultant magnetic moment vector 40 is being simultaneously directed in the positive y-direction by $H_w$ 80 and the positive x-direction by $H_B$ 90, which has the effect of causing effective magnetic moment vector 40 to further rotate in clockwise direction 94 until it is generally oriented at a 45° angle between the positive x- and positive y-directions. Consequently, magnetic moment vectors 53 and 57 will also further rotate in clockwise direction 94.

At a time $t_3$, write word current 60 is turned off so that now only $H_B$ 90 is directing resultant magnetic moment vector 40, which will now be oriented in the positive x-direction. Both magnetic moment vectors 53 and 57 will now generally be directed at angles passed their anisotropy hard-axis instability points.

At a time $t_4$, write bit current 70 is turned off so a magnetic field force is not acting upon resultant magnetic moment vector 40. Consequently, magnetic moment vectors 53 and 57 will become oriented in their nearest preferred directions to minimize the anisotropy energy. In this case, the preferred direction for magnetic moment vector 53 is at a 45° angle relative to the positive y- and positive x-directions. This preferred direction is also 180° from the initial direction of magnetic moment vector 53 at time to and is defined as '0'. Hence, MRAM device 10 has been switched to a '0'. It will be understood that MRAM device 10 could also be switched by rotating magnetic moment vectors 53, 57, and 40 in counter clockwise direction 96 by using negative currents in both write word line 20 and write bit line 30, but is shown otherwise for illustrative purposes.

Figure 6:
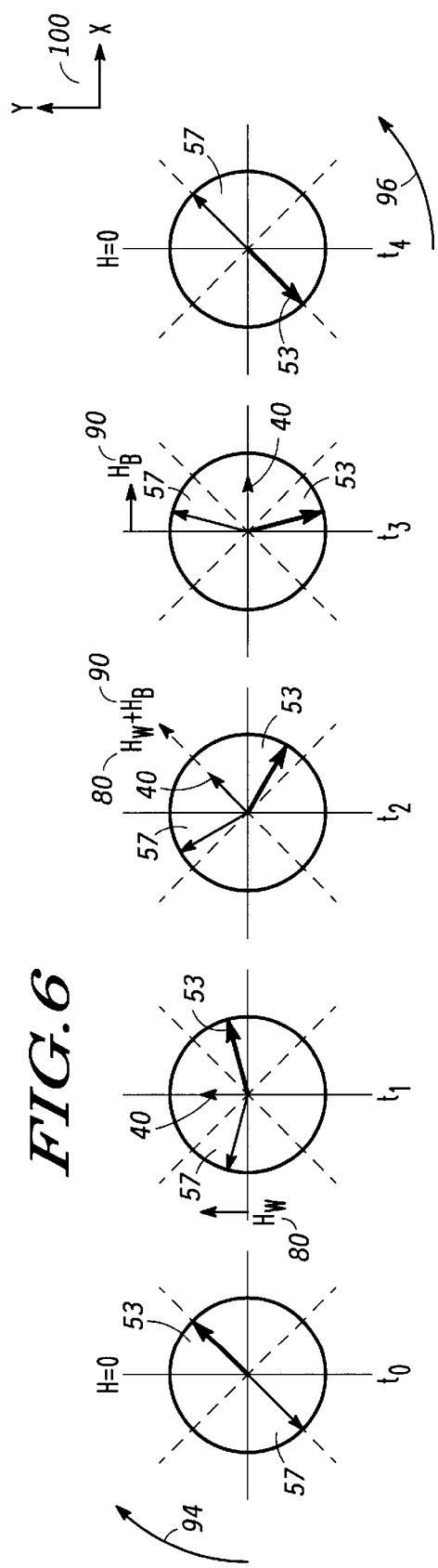
FIG. 6 is a diagram illustrating the rotation of the magnetic moment vectors for a magnetoresistive random access memory device for the toggle write mode when writing a '0' to a '1'.

Turn now to FIG. 6 which illustrates the toggle write mode for writing a '0' to a '1' using pulse sequence 100. Illustrated are the magnetic moment vectors 53 and 57, as well as resultant magnetic moment vector 40, at each of the times $t_0$, $t_1$, $t_2$, $t_3$, and $t_4$ as described previously showing the ability to switch the state of MRAM device 10 from '0' to 1' with the same current and magnetic field directions. Hence, the state of MRAM device 10 is written to with toggle write mode, which corresponds to region 97 in FIG. 3.

For the direct write mode, it is assumed that magnetic moment vector 53 is larger in magnitude than magnetic moment vector 57, so that magnetic moment vector 40 points in the same direction as magnetic moment vector 53, but has a smaller magnitude in zero field. This unbalanced moment allows the dipole energy, which tends to align the total moment with the applied field, to break the symmetry of the nearly balanced SAF. Hence, switching can occur only in one direction for a given polarity of current.

Figure 7:
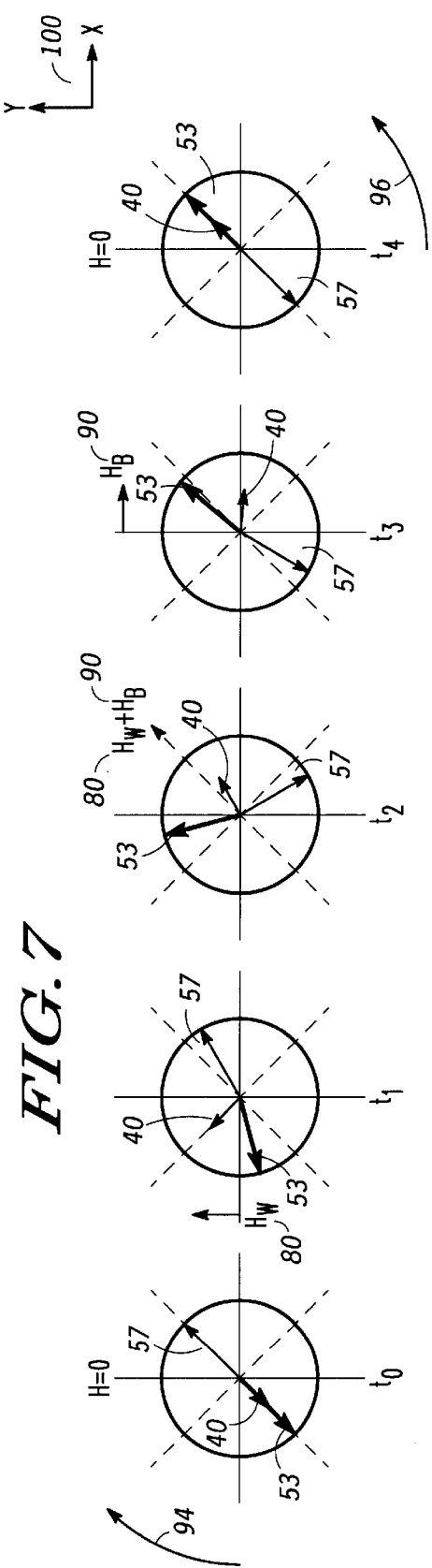
FIG. 7 is a graph illustrating the rotation of the magnetic moment vectors for a magnetoresistive random access memory device for the direct write mode when writing a '1' to a '0'.

Turn now to FIG. 7 which illustrates an example of writing a '1' to a '0' using the direct write mode using pulse sequence 100. Here again, the memory state is initially a '1' with magnetic moment vector 53 directed 45° with respect to the negative x- and negative y-directions and magnetic moment vector 57 directed 45° with respect to the positive x- and positive y-directions. Following the pulse sequence as described above with positive write word current 60 and positive write bit current 70, the writing occurs in a similar manner as the toggle write mode as described previously. Note that the moments again 'FLOP' at a time $t_1$, but the resulting angle is canted from 90° due to the unbalanced moment and anisotropy. After time $t_4$, MRAM device 10 has been switched to the '0' state with resultant magnetic moment 40 oriented at a 45° angle in the positive x- and positive y-directions as desired. Similar results are obtained when writing a '0' to a '1' only now with negative write word current 60 and negative write bit current 70.

Figure 8:
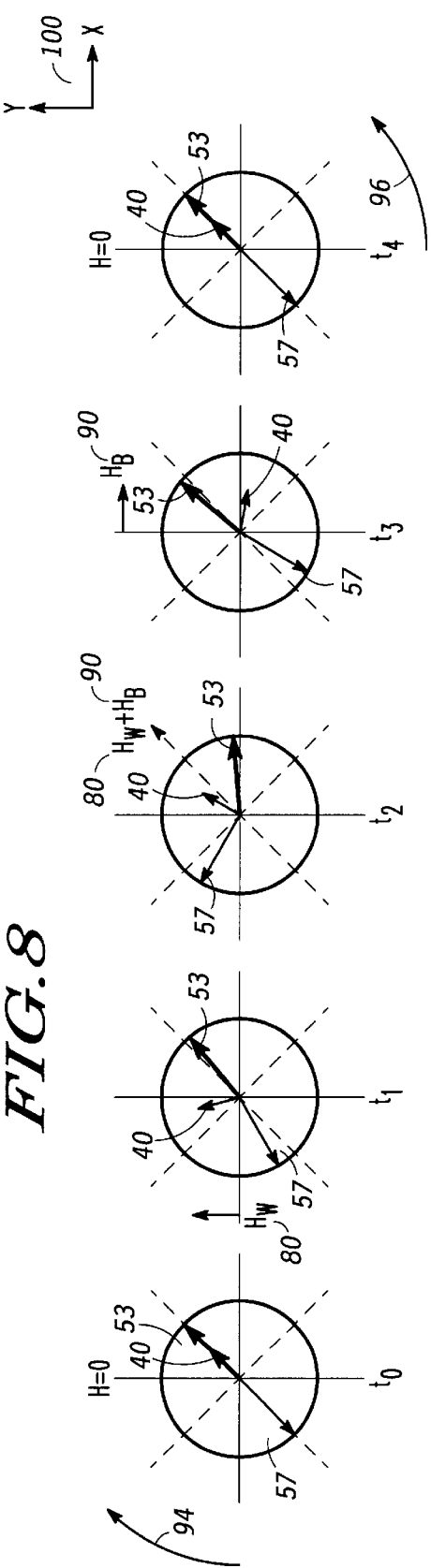
FIG. 8 is a graph illustrating the rotation of the magnetic moment vectors for a magnetoresistive random access memory device for the direct write mode when writing a '0' to a state that is already a '0'.

Turn now to FIG. 8 which illustrates an example of writing using the direct write mode when the new state is the same as the state already stored. In this example, a '0' is already stored in MRAM device 10 and current pulse sequence 100 is now repeated to store a '0'. Magnetic moment vectors 53 and 57 attempt to "FLOP" at a time $t_1$, but because the unbalanced magnetic moment must work against the applied magnetic field, the rotation is diminished. Hence, there is an additional energy barrier to rotate out of the reverse state. At time $t_2$, the dominant moment 53 is nearly aligned with the positive x-axis and less than 45° from its initial anisotropy direction. At a time $t_3$, the magnetic field is directed along the positive x-axis. Rather than rotating further clockwise, the system now lowers its energy by changing the SAF moment symmetry with respect to the applied field. The passive moment 57 crosses the x-axis and the system stabilizes with the dominant moment 53 returned to near its original direction. Therefore, at a time $t_4$ when the magnetic field is removed, and the state stored in MRAM device 10 will remain a '0'. This sequence illustrates the mechanism of the direct write mode shown as region 95 in FIG. 3. Hence, in this convention, to write a '0' requires positive current in both write word line 60 and write bit line 70 and, conversely, to write a '1' negative current is required in both write word line 60 and write bit line 70.

If larger fields are applied, eventually the energy decrease associated with a flop and scissor exceeds the additional energy barrier created by the dipole energy of the unbalanced moment which is preventing a toggle event. At this point, a toggle event will occur and the switching is described by region 97.

Region 95 in which the direct write mode applies can be expanded, i.e. toggle mode region 97 can be moved to higher magnetic fields, if the times $t_3$ and $t_4$ are equal or made as close to equal as possible. In this case, the magnetic field direction starts at 45° relative to the bit anisotropy axis when write word current 60 turns on and then moves to parallel with the bit anisotropy axis when write bit current 70 turns on. This example is similar to the typical magnetic field application sequence. However, now write word current 60 and write bit current 70 turn off substantially simultaneously, so that the magnetic field direction does not rotate any further. Therefore, the applied field must be large enough so that the resultant magnetic moment vector 40 has already moved past its hard-axis instability point with both write word current 60 and write bit current 70 turned on. A toggle writing mode event is now less likely to occur, since the magnetic field direction is now rotated only 45°, instead of 90° as before. An advantage of having substantially coincident fall times, $t_3$ and $t_4$, is that now there are no additional restrictions on the order of the field rise times $t_1$ and $t_2$. Thus, the magnetic fields can be turned on in any order or can also be substantially coincident.

Figure 9:
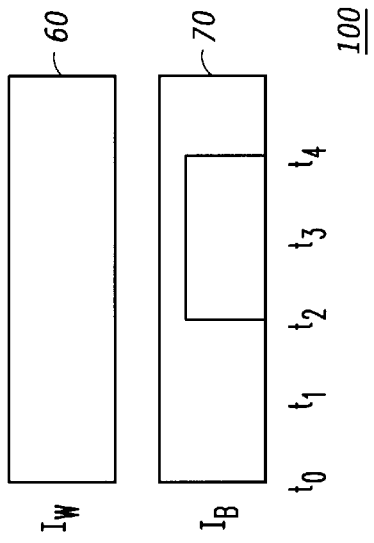
Figure 10:
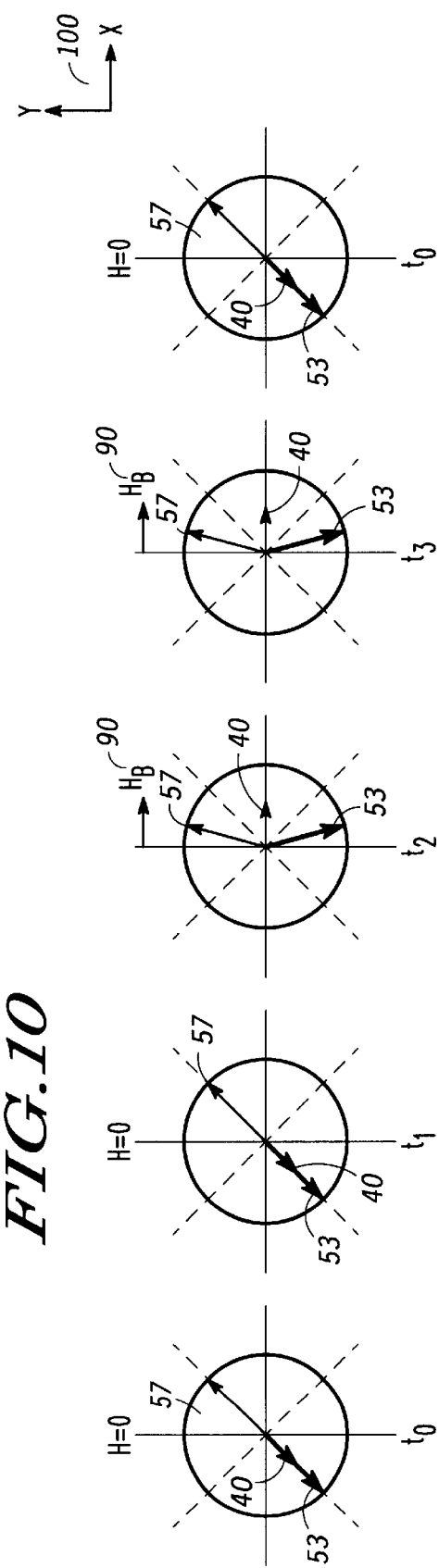

The writing methods described previously are highly selective because only the MRAM device that has both write word current 60 and write bit current 70 turned on between time $t_2$ and time $t_3$ will switch states. This feature is illustrated in FIGS. 9 and 10. FIG. 9 illustrates pulse sequence 100 when write word current 60 is not turned on and write bit current 70 is turned on. FIG. 10 illustrates the corresponding behavior of the state of MRAM device 10. At a time $t_0$, magnetic moment vectors 53 and 57, as well as resultant magnetic moment vector 40, are oriented as described in FIG. 2. In pulse sequence 100, write bit current 70 is turned on at a time $t_1$. During this time, $H_B$ 90 will cause resultant magnetic moment vector 40 to be directed in the positive x-direction.

Since write word current 60 is never switched on, resultant magnetic moment vectors 53 and 57 are never rotated through their anisotropy hard-axis instability points. As a result, magnetic moment vectors 53 and 57 will reorient themselves in the nearest preferred direction when write bit current 70 is turned off at a time $t_3$, which in this case is the initial direction at time $t_0$. Hence, the state of MRAM device 10 is not switched. It will be understood that the same result will occur if write word current 60 is turned on at similar times described above and write bit current 70 is not turned on. This feature ensures that only one MRAM device in an array will be switched, while the other devices will remain in their initial states. As a result, unintentional switching is avoided and the bit error rate is minimized.

Figure 11:
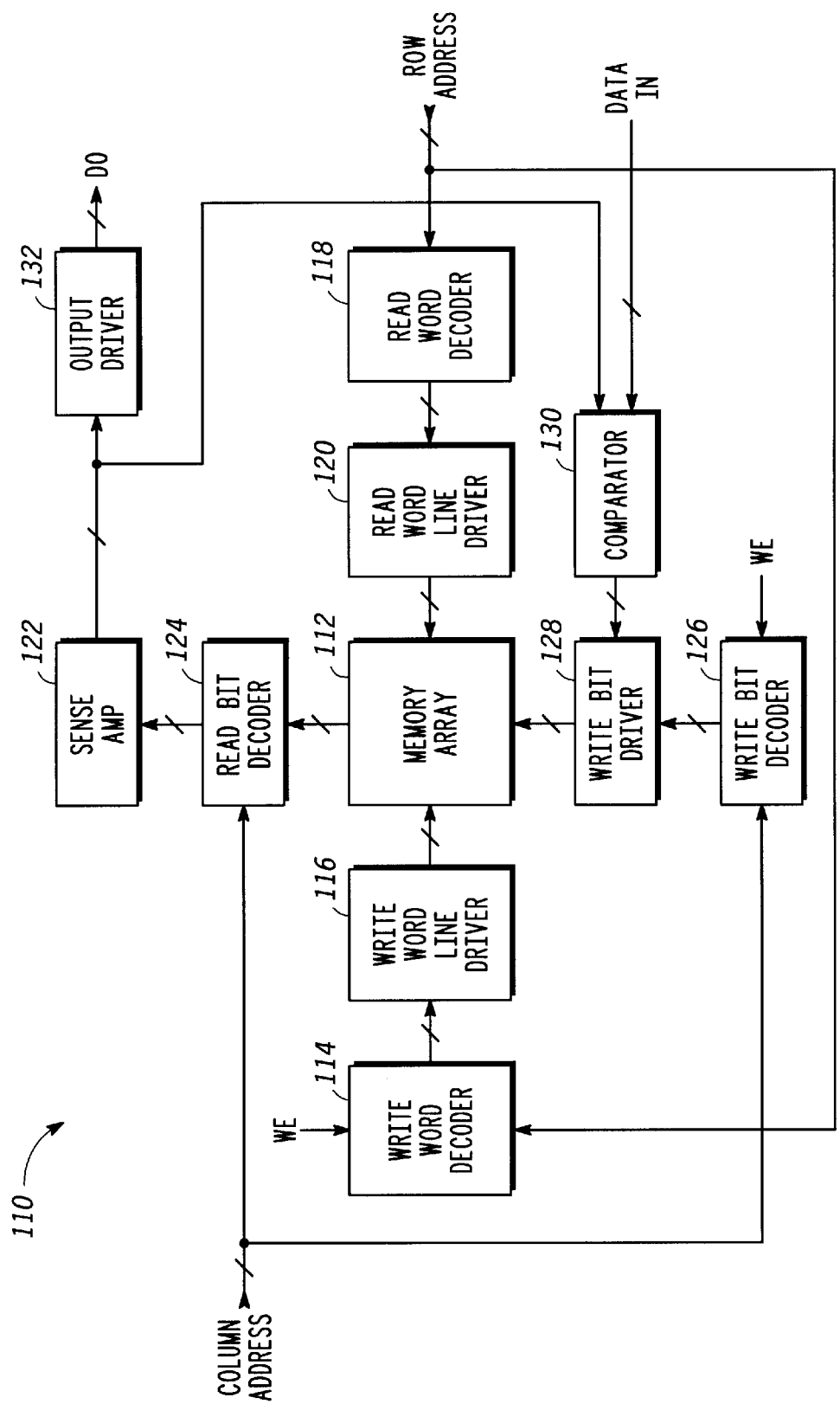
FIG. 11 is a block diagram of a toggle memory according to an embodiment of the invention.

Shown in FIG. 11 is a memory 110 comprising a memory array 112, a write word decoder 114, a write word line driver 116, a read word decoder 118, a read word line driver 120, one or more sense amplifiers 122, a read bit decoder 124, a write bit decoder 126, a write bit driver 128, a comparator 130, and an output driver 132. These elements are coupled together by multiple lines. For example read bit decoder 124 receives a column address made up of multiple address signals. Memory array 112 is an array of memory cells that can be switched with a toggle operation. A section of memory cells for the memory array 112 is memory array 200 shown in FIG. 14, which is an MRAM cell array that is written in the method described for memory array 3 of FIG. 1 in that writing occurs in four steps of 45° angles until 180° is reached. In this particular preferred cell array, there are separate word lines and bit lines for a write operation and a read operation.

Read word decoder 118 receives a row address and is coupled to read word line driver 120, which in turn is coupled to memory array 112. For a read, read word decoder 118 selects a read word line in memory array 112 based on the row address. The selected word line is driven by read line driver 120. Read bit decoder 124, which receives the column address and is coupled between sense amplifier 122 and memory array 112, selects a read bit line from read bit decoder 124, based on the column address, from memory array 112 and couples it to sense amplifier 122. Sense amplifier 122 detects the logic state and couples it to output driver 132 and comparator 130. Output driver 132, for a read, provides a data output signal DO. For a write operation, comparator 130 compares the logic state of the selected cell, which is provided by sense amplifier 122, to the desired logic state to be written as provided by the data in.

Write word decoder 114 receives the row address and is coupled to write word line driver 116, which in turn is coupled to memory array 112. For a write, write word decoder 114 selects a write word line, based on the row address, in memory array 112, and write word line driver in turn drives that selected write word line. Write bit decoder 126 receives the column address and is coupled to the write bit driver 128, which is coupled to the memory array 112. Writer bit decoder 126 selects a write bit line, based on the column address, and write bit driver 128 in turn drives the selected write bit line in order to toggle the state of the selected cell.

Since memory array 112 is a toggle memory, a write toggling operation is completed only if the logic state of the cell needs to be flipped in order to achieve the desired resulting logic state for the selected cell. Thus, comparator 130 receives the output of a read operation on the selected cell from sense amplifier 122 and determines if the selected cell already has the desired logic state. If the selected cell, as determined by the row and column address, does have the desired logic state, then the write operation is terminated. If the logic state of the selected cell is different from the desired state then the comparator indicates to write bit driver 128 that the write is to continue and the write bit driver for the selected write bit line drives the selected write bit line.

Figure 12:
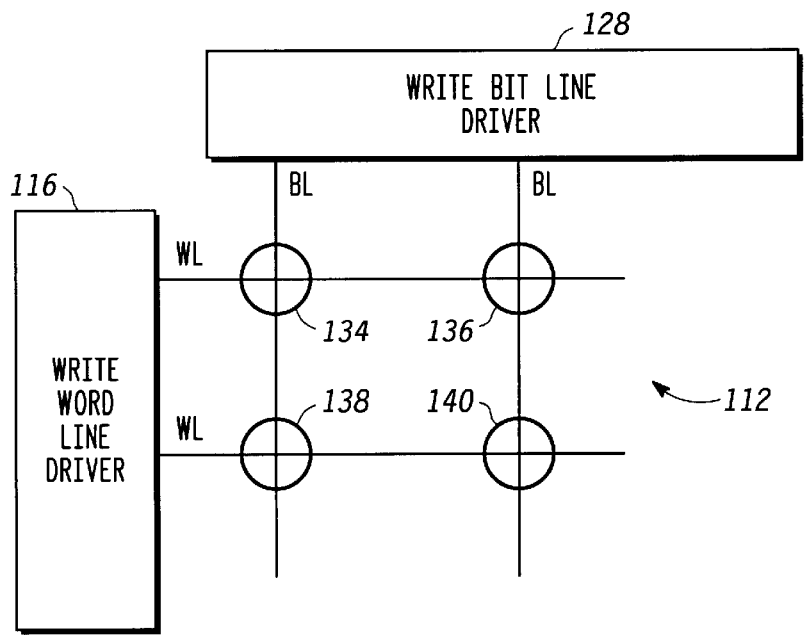
FIG. 12 is a more detailed diagram of a portion of the memory of FIG. 11.

Shown in FIG. 12 is a portion of memory 110 of FIG. 11 comprising the write word line driver 116 coupled to write word lines WL, write bit driver 128 coupled to write bit lines BL, and cells 134, 136, 138, and 140 coupled at intersection of write bit lines BL and write word lines WL. For a write to occur, current is provided to a selected word line WL, while no current is flowing in the selected write bit line, for sufficient time to cause the first angle change in the memory cells along the selected write word line. While current is still flowing in the selected write word line, current is flowed through the selected write bit line to cause the second angle change to the selected memory cell. Only at the intersection of the current carrying write bit line and write word line does this second angle change occur. While current is still flowing through the write bit line, current flow is terminated through the selected write word line to cause a third angle change in the selected memory cell. Only at the intersection of the selected write bit line and the selected write word line does this third change occur. A fourth angle change of the selected memory cell occurs when the current through the selected write bit line is terminated.

Figure 13:
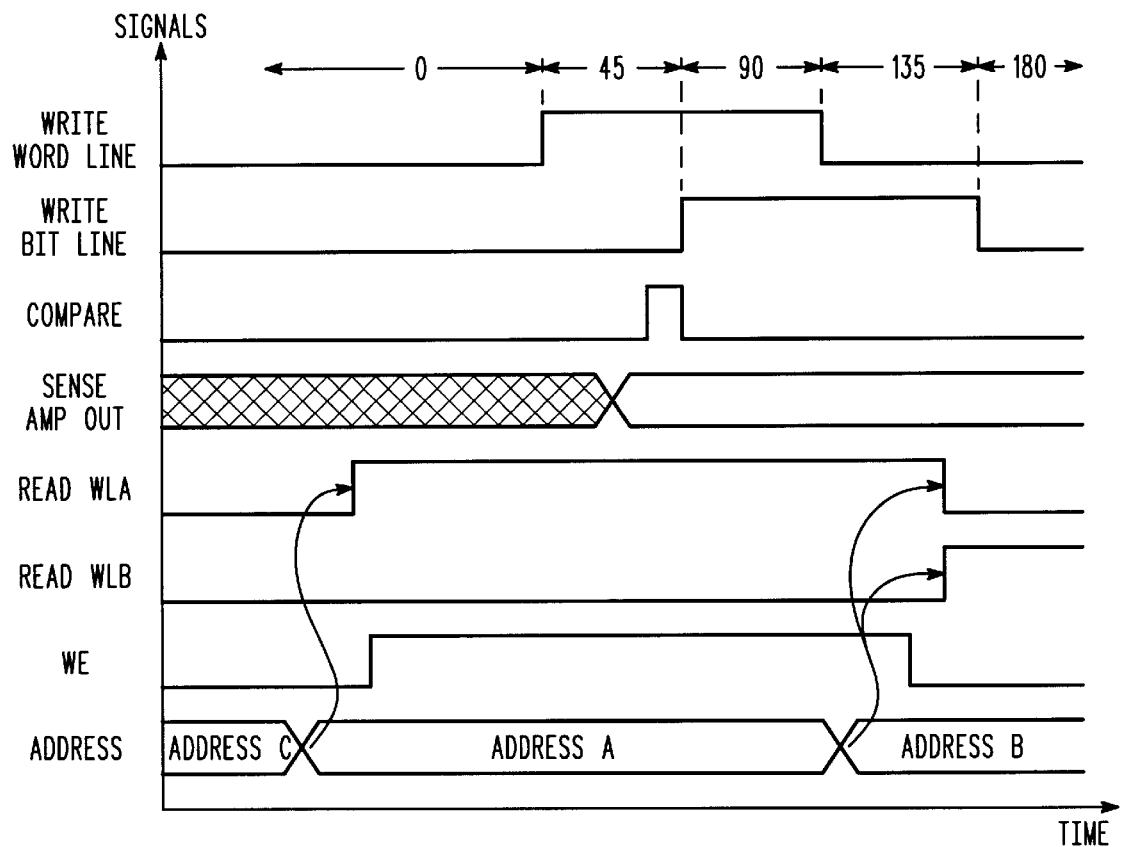
FIG. 13 is a timing diagram useful in understanding the operation of the memory of FIG. 11.

The write operation of memory 110 is further explained by-reference to the timing diagram of FIG. 13. Both a read operation and a write toggle operation are initiated by a change in the row or column address as shown by enabling a read word line WLA as shown in FIG. 13. Although the write cannot be executed until it has been determined that the logic state needs to flipped, nonetheless, the write cycle can begin as noted by the write word line being enabled prior to the sense amplifier providing its output and the comparator determining if the logic state needs to be flipped. Enabling (causing current to flow through) the write word line does cause the first angle change in the selected cell as well as all of the cells along the selected write word line, but this change is reversed if the current is terminated without enabling the write bit line.

Thus, the selected write word line can be enabled prior to the comparator making its determination because the first angle change is reversed simply by removing the current. This must be the case because all of the cells on a selected write word line experience the first angle change and all but one are not selected. Only the selected cell, however, experiences the second angle change and that occurs when the write bit line is enabled. This is shown as occurring after the comparator has made its determination that a logic state change is desired. The first angle change is shown as being from 0° to 45° and the second change is from 45° to 90°. The third angle change is shown as occurring when the write word line is disabled (current is terminated). This is shown as being from 90° to 135°. The final angle change shown is the fourth angle change and occurs when the write bit line is disabled. This angle change is shown as being from 135° to 180°.

This also shows that the final stages of the write can continue after the next address change, which initiates another cycle. The beginning of a cycle always begins with a read even if the cycle is a write cycle. Address A is changed to address B and causes read word line B to be selected. This does not interfere with the writing of the previously selected cell. This depicts a read word line change, but even if the address is a column only change so that the selected read word line does not change, the continued flow of current does not adversely affect the completion of the write. Also note that it is not necessary that the write enable be active at the time the cycle begins, because all cycles begin with a read operation anyway. The write enable signal must be active sufficiently early though for the write bit line to become active.

The explanation has been with respect to a single cell being selected, but this was for ease of understanding. In practice, typically a number of cells will be selected and that is indicated in FIG. 11 by the signal connections between the elements being multiple signal lines. Thus, for example, if memory 110 were a x16 memory, comparator 130 would actually make 16 different comparisons, one for each selected cell. Of the sixteen comparisons, only those that indicated a non-match would cause a write operation of those selected cells with the non-match. The selected cells that resulted in a match would not be flipped.

Figure 14:
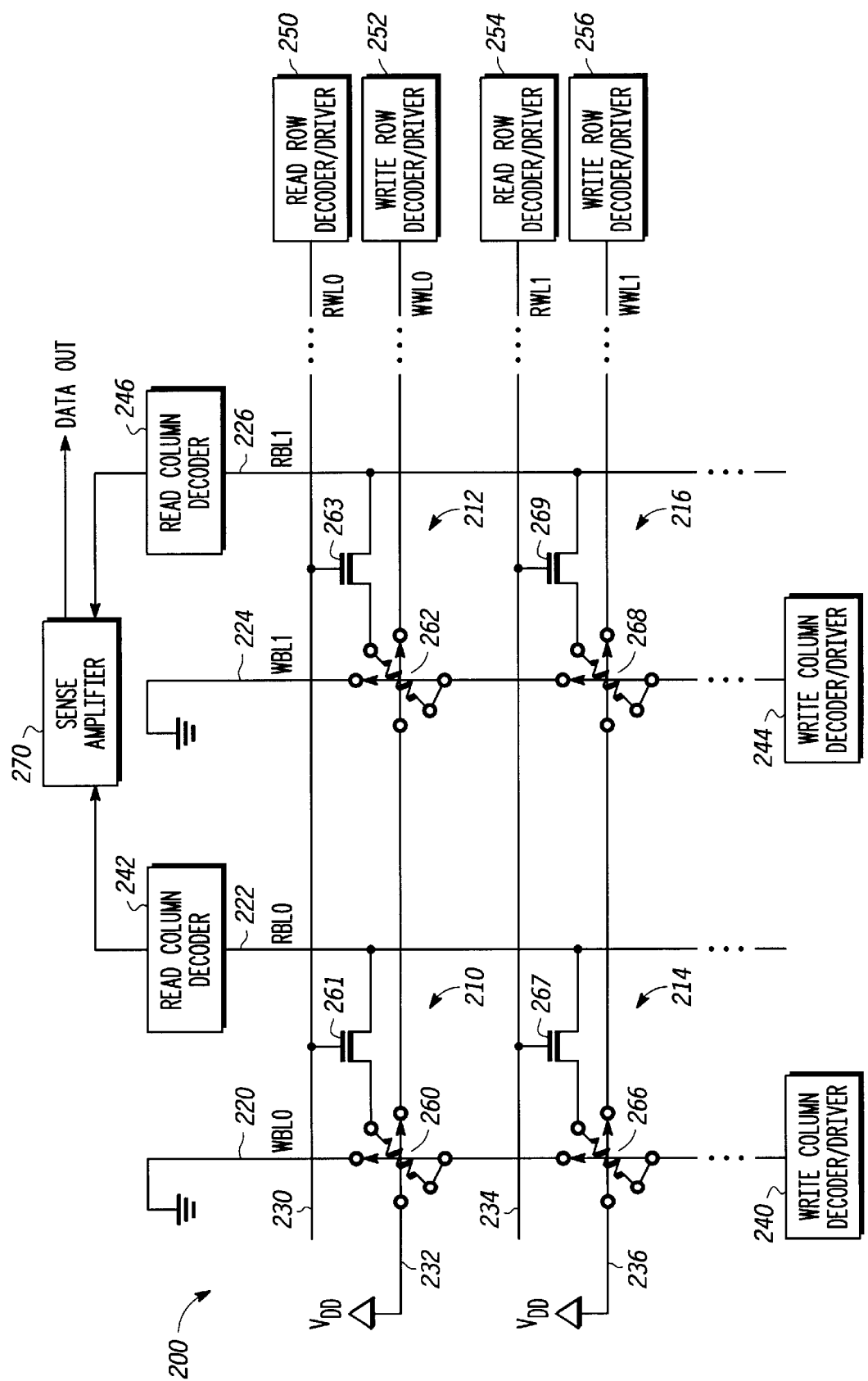
FIG. 14 is a circuit diagram of a portion of the memory of FIG. 11 showing an embodiment of the inventive architecture.

Illustrated in FIG. 14 is an MRAM architecture 200 with grounded write bit lines and electrically isolated read bit lines. The MRAM architecture generally has a plurality of intersecting write lines in the form of bit lines and word lines wherein a memory cell is located at each intersection of the bit lines and word lines. For each memory cell there is a write bit line and a read bit line. Similarly, for each memory cell there is a write word line and a read word line. For purposes of illustration, FIG. 14 includes a first write bit line 220 labeled WBL0, a first read bit line 222 labeled RBL0, a second write bit line 224 labeled WBL1, and a second read bit line 226 labeled RBL1. Additionally, FIG. 14 includes a first read word line 230 labeled RWL0, a first write word line 232 labeled WWL0, a second read word line 234 labeled RWL1, and a second write word line 236 labeled WWL1. For convenience of illustration, four memory cells are illustrated although it should be understood that many memory cells are implemented. A memory cell 210 has a magnetoresistive tunnel junction (MTJ) cell 260 and a select transistor 261. A memory cell 212 has a magnetoresistive tunnel junction cell 262 and a select transistor 263. A memory cell 214 has a magnetoresistive tunnel junction cell 266 and a select transistor 267. A memory cell 216 has a magnetoresistive tunnel junction cell 268 and a select transistor 269. Each of the MTJ cells 260, 262, 266 and 268 has three conduction paths, a first or horizontal conduction path, a second or vertical conduction path and a third or diagonal conduction path. The first and second conduction paths are write current conduction paths and the third conduction path is a sense current conduction path. A first terminal of a first conduction path of MTJ cell 260 is connected via Write Word Line 232 to a $V_{DD}$ power supply voltage terminal. The $V_{DD}$ power supply terminal is a positive voltage relative to ground. A second terminal of the first conduction path of MTJ cell 260 is connected to a first terminal of the first conduction path of MTJ cell 262. A first terminal of a second conduction path of MJT cell 260 is connected to a ground terminal via write bit line 220 by connecting a first end of write bite line 220 to ground. A second terminal of the second conduction path of MTJ cell 260 is connected to a first terminal of a second conduction path of MTJ cell 266. A first terminal of a third conduction path of MTJ cell 260 is connected to a first current electrode or a source of select transistor 261. A second terminal of the third conduction path of MTJ cell 260 is connected to the second terminal of the second conduction path thereof. A second current electrode or a drain of select transistor 261 is connected to Read Bit Line 222. A control electrode or gate of select transistor 261 is connected to Read Word Line 230. A second terminal of the first conduction path of MTJ cell 262 is coupled via Write Work Line 232 to a Write Row Decoder/Driver 252 which functions as a word row decoder and a word write driver. A first terminal of a second conduction path of MTJ cell 262 is connected to ground via the Word Bit Line 224. A second terminal of the second conduction path of MTJ cell 262 is connected via Write Bit Line 224 to a first terminal of a second conduction path of MTJ cell 268. A first terminal of a third conduction path of MTJ cell 262 is connected to a first current electrode or a source of select transistor 263. A second terminal of the third conduction path of MTJ 262 is connected to the second terminal of the second conduction path thereof. A second current electrode or a drain of select transistor 263 is connected to Read Bit Line 226. A control electrode or gate of select transistor 263 is connected to the read word line 230. A first terminal of a first conduction path of MTJ cell 266 is connected via Write Word Line 236 to a $V_{DD}$ power supply voltage terminal. A second terminal of the first conduction path of MTJ cell 266 is connected to a first terminal of the first conduction path of MTJ cell 268. A second terminal of second conduction path of MTJ cell 266 is coupled via Write Bit Line 220 to a Write Column Decode/Driver 240 which functions as a bit column decoder and a bit write driver. A first terminal of a third conduction path of MTJ cell 266 is connected to a first current electrode or source of select transistor 267. A second terminal of the third conduction path of MTJ cell 266 is connected to the second terminal of the second conduction path thereof. A control electrode or gate of select transistor 267 is connected to the Read Word Line 234, and a second current electrode or drain of transistor 267 is connected to the Read Bit Line 222. A second terminal of the first conduction path of MTJ cell 268 is coupled via Write Word Line 236 to a Write Row Decoder/Driver 256 which functions as a word row decoder and word write driver. A second terminal of a second conduction path of MTJ cell 268 is coupled via Write Bit Line 224 to a Write Column Decoder/Driver 244 which functions as a bit column decoder and a bit write driver. A first terminal of the third conduction path of MTJ cell 268 is connected to a first current electrode or source of select transistor 269. A second terminal of the third conduction path of MTJ cell 268 is connected to a second terminal of the second conduction path thereof. A control electrode or gate of select transistor 269 is connected to the Read Word Line 234. A second current electrode or drain of select transistor 269 is connected to the read bit line 226. A Read Row Decoder/Driver 250 is connected to Read Word Line 230. Read Row Decoder/Driver 250 functions as a read row decoder and a read word driver. A Read Row Decoder/Driver 254 is connected to Read Word Line 234. An input of a read column decoder 242 is connected to the read bit line 222. An output of the read column decoder is connected to a first input of a sense amplifier 270. An input of a read column decoder 246 is connected to the read bit line 226. An output of the read column decoder 246 is connected to a second input of sense amplifier 270. An output of sense amplifier 270 is connected to a data output for providing Data Out.

In operation, assume a toggle write operation on memory cell 210 within the MRAM architecture 200 is desired to toggle the state of the memory cell. First, in response to decoding a memory row address, write row decoder/driver 252 forces a first current above the write threshold through write word line 232 via memory cells 210 and 212 and others (not shown) from the $V_{DD}$ terminal to a ground terminal (not shown) within write row decoder/driver 252. Then, while write row decoder/driver 252 maintains its current, in response to decoding a memory column address, write column decoder/driver 240 forces a second current above the write threshold through write bit line 220 via memory cells 210 and 214 and others (not shown) to the ground terminal. Then, while write row decoder/driver 240 maintains its current, write row decoder/driver 252 stops driving the first current. Write column decoder/driver 240 then stops driving the second current. This sequence of currents causes the state of MTJ cell 260 to change by manipulating the magnetic field as described above.

Now assume that a read operation on memory cell 210 within the MRAM architecture 200 is desired to read the state of the memory cell. Firstly, in response to decoding a memory row address, read row decoder/driver 250 asserts row word line 230 by raising the voltage potential of row word line 230 to an elevated voltage. Select transistor 261 then connects one terminal of the third current path, the read current path through the magnetic tunnel junction, of MJT cell 260 to read bit line 222. Select transistor 263 also connects one terminal of the third current path, the read current path, of MJT cell 262 to read bit line 226. In response to decoding a memory column address, read column decoder 242 is asserted connecting read bit line 222 to sense amplifier 270 sensing the state of the MTJ in memory cell 210. Read column decoder 246 is not asserted. In response to the sensing operation, sense amplifier 270 provides an output signal, Data Out, indicating the bit state of memory cell 210.

Figure 15:
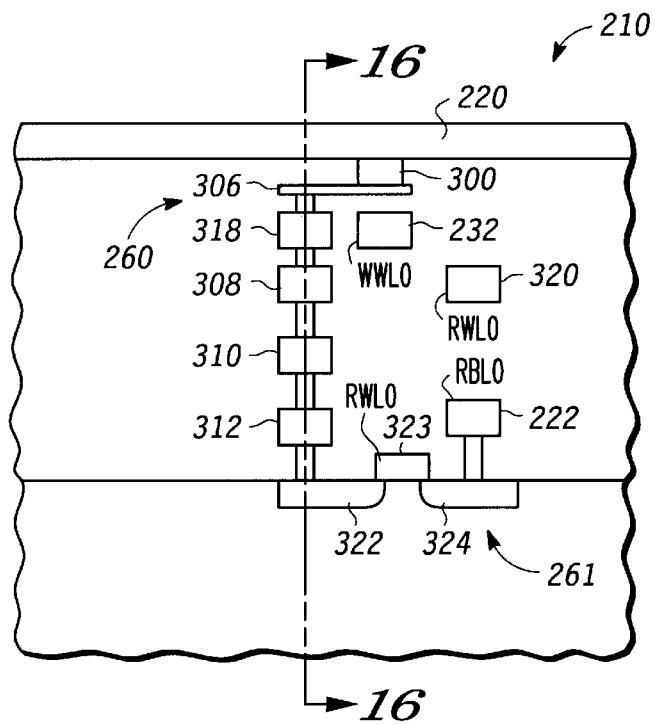
FIG. 15 is a first cross section of a memory cell used in an implementation of the architecture of FIG. 14.

Shown in FIG. 15 is a representation of a cross section of a memory cell comprised of MJT cell 260 and select transistor 261. This shows the common elements of a MRAM device arranged to take advantage of the architecture of FIG. 14. In a typical application of MRAM technology, the MRAM devices will be present on a circuit with extensive logic such as a microprocessor. In such a case there would be several levels of metal to accommodate the logic design, and the storage element of the MRAM device would be manufactured after those metal layers have been formed. This is due to the typical tunnel junction not being able to sustain temperatures above about 400 degrees Celsius without degradation.

Memory cell 210 comprises a tunnel junction 300 connected to and in close proximity to write bit line 220 and an interconnect 306, and in close proximity to write current path 232. Transistor 261 comprises a source 322, a drain 324, and a gate 323. The source 322 of transistor 261 is connected to MRAM device 260 via an interconnect 318, an interconnect 308, an interconnect 310, and an interconnect 312, which are formed as metal layers for use by logic. These metal interconnect layers are connected together by vias as is well known. Write current path 232 is formed in the same metal layer as interconnect 318. Gate 323 is part of the read word line RWL0 230 and is periodically connected to interconnect 320. The use of interconnect 320 is to reduce the resistance of RWL0 230. This is a common strapping technique to avoid the relatively high resistance of polysilicon. Read bit line 222 is connected to the drain 324 of transistor 261 via an interconnect.

Figure 16:
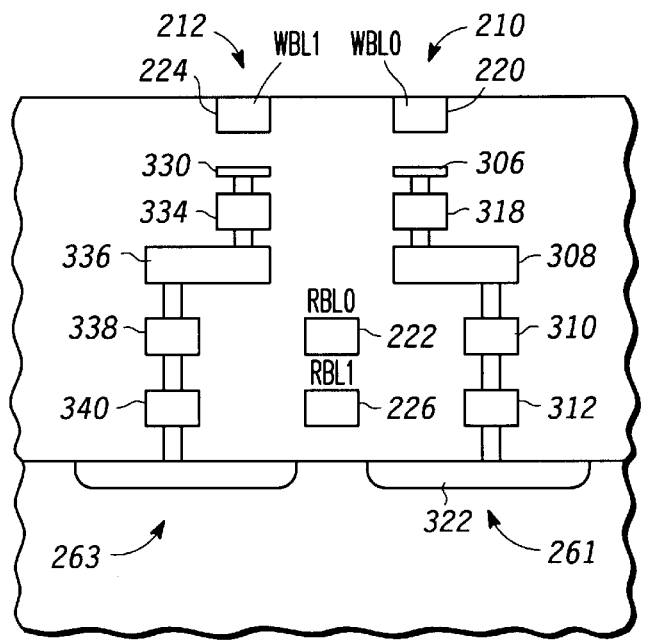
FIG. 16 is a second cross section of the memory cell of FIG. 15.

Shown in FIG. 16 is a cross section taken through memory cell 210 and the source 322 of transistor 261 as indicated in FIG. 15. This cross section is extended to include memory cell 212 and transistor 263. This shows read bit line RBL0 222 at the same level of interconnect as interconnect 310 and read bit line RBL1 226 at the same level of interconnect as interconnect 312. Notice that tunnel junction 300 and WWL0 232 are offset from the cross section line and so are not present in FIG. 16. The portion of memory cell 212 present in FIG. 16 is write bit line WBL1 224. Similar to memory cell 210, the third current path of memory cell 212 is connected to transistor 263 by interconnect 340, interconnect 338, interconnect 336, interconnect 334 and interconnect 330. Interconnects 306 and 330 provide the direct connection to the tunnel junctions of memory cells 210 and 202, respectively. These cross sections show that this architecture can be made without requiring unusual structures that would require special processing.

By now it should be apparent that an improved MRAM architecture has been provided. The disclosed MRAM architecture improves both memory speed and memory area efficiency. In particular, read speed is improved without sacrificing write efficiency. Within this architecture, the bit select transistor couples one end or terminal of the magnetic tunnel junction (MTJ) directly to the bit line rather than connecting one terminal of the tunnel junction to ground as is the case of other architectures. The second terminal of the tunnel junction is connected to the write bit line with the write bit line connected to ground or another reference terminal voltage. The direct connection via the select transistor of the MTJ to the bit line allows electrical isolation of the read bit line from the write bit line, thereby significantly reducing the capacitance on the read bit line and improving the speed of the sensing operation. In contrast, if the read bit line and the write bit line are the same conductor, then switches are required on each end to isolate the bit line during the read operation. These switches couple significant parasitic capacitance to the bit line, thereby slowing the sensing operation significantly. In addition, these switches are necessarily large in order to provide a small resistance to the significant write current. Thus, the elimination of a switch on one end of each write bit line results in a significant size savings in the memory architecture 200.

Various changes and modifications to the embodiments herein chosen for purposes of illustration will readily occur to those skilled in the art. For example, the illustrated transistors may be implemented with any type of transistor and various conductivities may be implemented. Various types of magnetoresistive memory cells may be implemented using the memory architecture described herein. Although a particular type of MRAM cell is described and discussed herein, MRAM cells that operate on different principles may be used. The present invention may be scaled to various semiconductor manufacturing processes. The number of interconnects illustrated in FIGS. 15 and 16 are by way of example and may either be increased or reduced for a specific application. Any type of sense amplifier architecture may be used in connection with implementing the sense amplifiers illustrated in the figures. Additionally, various implementations of column and row decoders and memory drivers may be used. It should be understood that the illustrated word and bit lines may be interchanged from that shown or that word and bit lines may be alternated rather than segregated in a row and column layout. Any bit size of memory may be implemented and any groupings by sections of memory cells may be implemented. To the extent that such modifications and variations do not depart from the spirit of the invention, they are intended to be included within the scope thereof that is assessed only by a fair interpretation of the following claims.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

I claim:

1. A memory, comprising:
    a first magnetoresisitve tunnel junction (MTJ) having a first terminal and a second terminal;
    a first transistor having a first current electrode coupled to the first terminal of the first MTJ, a second current electrode, and a control electrode;
    a first write bit line passing in close proximity to the first MTJ substantially in a first direction and coupled to the second terminal of the first MTJ;
    a first write word line in close proximity to the first MTJ substantially in a second direction orthogonal to the first direction;
    a first read word line coupled to the control electrode of the first transistor;
    a sense amplifier; and
    a first read bit line coupling the second current electrode of the first transistor to the sense amplifier.

2. The memory of claim 1, wherein the first write bit line has a first end coupled to ground and a second end coupled to a first bit write driver.

3. The memory of claim 2, wherein the first write word line has a first end coupled to a positive power supply terminal and a second end coupled to a word write driver.

4. The memory of claim 1, further comprising:
    a second MTJ having a first terminal and a second terminal;
    a second transistor having a first current electrode coupled to the first terminal of the second MTJ, a second current electrode, and a control electrode, wherein the first write word line is in close proximity to the second MTJ substantially in the second direction and the first read word line is coupled to the control electrode of the second transistor;

a second write bit line passing in close proximity to the second MTJ substantially in the first direction and coupled to the second terminal of the second MTJ; and a second read bit line coupling the second current electrode of the second transistor to the sense amplifier.

5. The memory of claim 4, wherein the first write bit line has a first end coupled to ground and a second end coupled to a first bit write driver and the second write bit line has a first end coupled to ground and a second end coupled to a second bit write driver.

6. The memory of claim 4, further comprising:

a third MTJ having a first terminal and a second terminal;

a third transistor having a first current electrode coupled to the first terminal of the third MTJ, a second current electrode, and a control electrode, wherein first write bit line passes in close proximity to the third MTJ substantially in the first direction and is coupled to the second terminal of the third MTJ and the first read bit line couples the second current electrode of the third transistor to the sense amplifier;

a second write word line in close proximity to the third MTJ substantially in the second direction; and a second read word line coupled to the control electrode of the third transistor.

7. The memory of claim 6, wherein the first write bit line has a first end coupled to ground and a second end coupled to a first bit write driver and the second write bit line has a first end coupled to ground and a second end coupled to a second bit write driver.

8. The memory of claim 6, further comprising:

a fourth MTJ having a first terminal and a second terminal;

a fourth transistor having a first current electrode coupled to the first terminal of the fourth MTJ, a second current electrode, and a control electrode;

wherein:

the second write word line is in close proximity to the fourth MTJ and substantially in the second direction;

the second read word line is coupled to the control electrode of the fourth transistor;

the second write bit line passes in close proximity to the fourth MTJ substantially in the first direction and is coupled to the second terminal of the fourth MTJ; and the second read bit line couples the second current electrode of the fourth transistor to the sense amplifier.

9. The memory of claim 8, wherein the first write bit line has a first end coupled to ground and a second end coupled to a first bit write driver and the second write bit line has a first end coupled to ground and a second end coupled to a second bit write driver.

10. A memory comprising:

an array of random access memory cells arranged in a plurality of rows and columns, each of the random access memory cells comprising:

a MTJ having a first terminal and a second terminal; and a transistor having a first current electrode coupled to the first terminal of the MTJ, a second current electrode, and a control electrode;

wherein each column has:

a write bit line associated therewith, wherein each write bit line passes in close proximity to each MTJ in the column to which the write bit line is associated, passes substantially in a first direction, and is coupled to the second terminal of each MTJ in each column; and a read bit line associated therewith for carrying stored data in a selected memory cell in the column by being coupled to the second current electrode of transistors in each column; and wherein each row has:

a write word line associated therewith, wherein each row is in close proximity to each MTJ in the row with which it is associated and substantially in a second direction orthogonal to the first direction; and a read word line associated with each row coupled to the control electrode of the transistor to which it is associated in the row with which it is associated.

11. The memory of claim 10, further comprising a plurality of bit write drivers, wherein each write bit line has a first end coupled to ground and a second end coupled to one of the plurality of bit write drivers.

12. A method of reading a state of a selected memory cell, comprising:

providing an array of random access memory cells arranged in a plurality of rows and columns, each of the random access memory cells comprising:

a MTJ having a first terminal and a second terminal; and a transistor having a first current electrode coupled to the first terminal of the MTJ, a control electrode coupled to one of a plurality of word lines, and a second current electrode;

providing a plurality of write lines aligned with the rows and columns in close proximity to the MTJs, wherein each MTJ is coupled to one of the plurality of write lines;

providing a sense amplifier; and coupling the second current electrode of the transistor of the selected cell to the sense amplifier.

13. The method of claim 12, wherein the write lines aligned with the columns each have a first end coupled to ground.

14. A memory, comprising:

an array of random access memory cells arranged in a plurality of rows and columns, each of the random access memory cells comprising:

a MTJ having a first terminal and a second terminal; and a transistor having a first current electrode coupled to the first terminal of the MTJ, a control electrode coupled to one of a plurality of word lines, and a second current electrode;

a plurality of write lines aligned with the rows and columns in close proximity to the MTJs, wherein each MTJ is coupled to one of the plurality of write lines; and sensing means, coupled to each second current electrode of the transistors, for sensing states of selected memory cells.

15. The memory of claim 14, further comprising a decoder for selectively coupling each second current electrode of the transistors to the sensing means.

16. The memory of claim 15, wherein the write lines aligned with the columns each have a first end coupled to ground.

17. The memory of claim 16, further comprising write drivers for driving the write lines to toggle selected cells.

18. The memory of claim 14, further comprising a plurality of read bit lines aligned with the columns coupled to the second current electrodes of the transistors.

19. The memory of claim 18, further comprising decoder means for selectively coupling read bit lines to the sensing means.

20. The memory of claim 14, wherein the MTJs have states, further comprising driver means coupled to the plurality of write lines for passing current through the plurality of write lines to alter the states of MTJs.

* * * * *